US011455565B2

(12) United States Patent
Bogdoll et al.

(10) Patent No.: US 11,455,565 B2
(45) Date of Patent: *Sep. 27, 2022

(54) AUGMENTING REAL SENSOR RECORDINGS WITH SIMULATED SENSOR DATA

(71) Applicant: Ford Global Technologies, LLC, Dearborn, MI (US)

(72) Inventors: Daniel Bogdoll, Aachen (DE); Shreyasha Paudel, Stanford, CA (US); Tejaswi Koduri, Palo Alto, CA (US)

(73) Assignee: Ford Global Technologies, LLC, Dearborn, MI (US)

( * ) Notice: Subject to any disclaimer, the term of this patent is extended or adjusted under 35 U.S.C. 154(b) by 1221 days.

This patent is subject to a terminal disclaimer.

(21) Appl. No.: 15/693,265

(22) Filed: Aug. 31, 2017

(65) Prior Publication Data

US 2019/0065637 A1 Feb. 28, 2019

(51) Int. Cl.
*G06N 20/00* (2019.01)
*G06F 30/20* (2020.01)
*G06F 30/15* (2020.01)
*G01S 17/931* (2020.01)

(52) U.S. Cl.
CPC ............ *G06N 20/00* (2019.01); *G06F 30/20* (2020.01); *G01S 17/931* (2020.01); *G06F 30/15* (2020.01)

(58) Field of Classification Search
None
See application file for complete search history.

(56) References Cited

U.S. PATENT DOCUMENTS

| 7,313,506 | B2 | 12/2007 | Kacyra |
| 8,179,393 | B2 | 5/2012 | Minear |
| 8,244,026 | B2 | 8/2012 | Nahari |
| 8,488,877 | B1 | 7/2013 | Owechko |
| 8,941,641 | B2 | 1/2015 | Chen |
| 9,476,983 | B2 | 10/2016 | Zeng |
| 9,523,772 | B2 | 12/2016 | Rogan |
| 2009/0185741 | A1* | 7/2009 | Nahari ............... G01C 15/002 382/154 |
| 2011/0181589 | A1 | 7/2011 | Quan |
| 2012/0200743 | A1 | 8/2012 | Blanchflower |
| 2013/0083011 | A1 | 4/2013 | Geisner |
| 2013/0178257 | A1 | 7/2013 | Langseth |
| 2013/0265333 | A1 | 10/2013 | Ainsworth |

(Continued)

*Primary Examiner* — Boris Gorney
*Assistant Examiner* — Michael Edward Cocchi
(74) *Attorney, Agent, or Firm* — David R. Stevens; Stevens Law Group

(57) ABSTRACT

Original sensor data is received from one or more sensors of a vehicle. Free space around the vehicle is identified according to the sensor data, such as by identifying regions where data points have a height below a threshold. A location for an object model is selected from the free space. A plane is fitted to sensor data around the location and the object model is oriented according to an orientation of the plane. Sensing of the object model by a sensor of the vehicle is simulated to obtain simulated data, which is then added to the original sensor data. Sensor data corresponding to objects that would have been obscured by the object model is removed from the original sensor data. Augmented sensor data may be used to validate a control algorithm or train a machine learning model.

20 Claims, 10 Drawing Sheets

(56) References Cited

U.S. PATENT DOCUMENTS

| | | | |
|---|---|---|---|
| 2014/0368493 A1* | 12/2014 | Rogan | G06V 10/462 345/419 |
| 2015/0040074 A1 | 2/2015 | Hofmann | |
| 2016/0216377 A1* | 7/2016 | Sane | G01S 7/4808 |
| 2017/0200310 A1 | 7/2017 | Kapinos | |
| 2019/0302259 A1* | 10/2019 | Van Fleet | G05D 1/024 |

* cited by examiner

AUGMENTING REAL SENSOR RECORDINGS WITH SIMULATED SENSOR DATA

RELATED APPLICATIONS

This application is related to U.S. application Ser. No. 15/693,203, filed Aug. 31, 2017, the disclosure of which is incorporated herein by reference in its entirety.

BACKGROUND

Field of the Invention

This invention relates to simulating sensing of a scenario using one or more electronic sensors.

Background of the Invention

The challenge in testing and validation of driver assistance technologies and autonomous vehicles arises from the large number of test cases and very rare corner cases. While a wide variety of cases are encountered during real-world testing, there are certain scenarios which are very rare in real-world and are too risky to execute on a proving ground. Detailed simulations are usually used to prove out these scenarios. However, due to the lack of perfect sensor models and traffic models, the data generated from these simulations are very realistic but still do not mimic all the imperfections in the real-world.

The system and methods disclosed herein provide an improved approach for generating scenarios from recorded sensor data by augmenting these with simulated sensor data.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

Figure 1A:
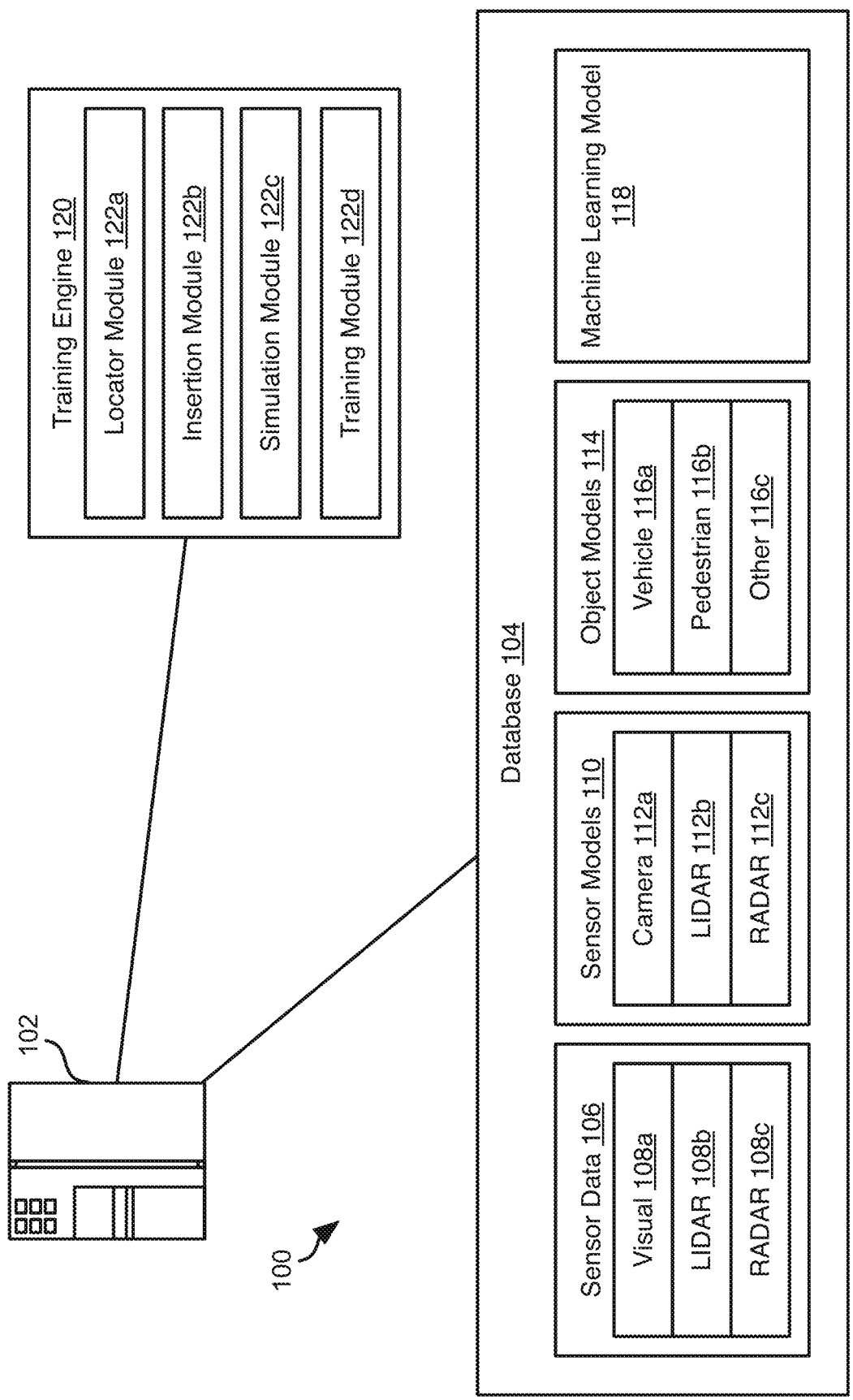
FIGS. 1A and 1B are schematic block diagrams of a system for implementing embodiments of the invention.

Referring to FIG. 1, a computing environment 100 may include a server system 102 that may host or access a database 104 storing data for use in accordance with the methods disclosed herein. In particular, the database 104 may store sensor data 106 that is received from sensors of a vehicle while driving in an actual environment. The sensor data may include one or more of visual data 108a (e.g., the output of one or more visible light cameras or infrared cameras), LIDAR (light detection and ranging) data 108b output by a LIDAR sensor of the vehicle, RADAR (radio detection and ranging) data 108c output by a RADAR sensor. Other types of sensor data 106 may also be stored such as outputs of microphones, ultrasonic sensors, or other types of sensors. The sensor data 108a-108c for each sensor may include a series of data sets output over a period of time during traversal of a path by the vehicle.

The database 104 may further store one or more sensor models 110. The sensor models 110 define data sufficient to enable simulated perception of a three-dimensional (3D) model by an actual sensor. For example, a camera model 112a may define data defining distortion, color transformation, frame rate, resolution, zoom, field of view, orientation, or other artifacts of a camera that would affect perception of a scene.

A LIDAR model 112b may define scanning rate, point density, scanning laser wavelength, beam properties, detector sensitivity, field of view, etc. A RADAR sensor model 112c may define limitations and attributes of a RADAR system, e.g. wavelength, signal amplitude, angular scanning speed, antenna gain, field of view, etc. Where other types of sensor data 106 are present, other types of sensor models 110 may be defined for these types of sensors. For example, for a microphone, the sensor model 110 may include the gain, signal to noise ratio, sensitivity profile (sensitivity vs. frequency), and the like.

These generated data can be used for several purposes: Training a Deep Neural Network (see paragraph 17), testing and verifying automated driving algorithms in the fields of perception, scene understanding, object detection, mission planning, path planning and control. These tests can be designed as open or closed loop tests.

The database 104 may further include object models 114. The object models 114 may include 3D models of objects likely to be encountered by a vehicle, such as other vehicles 116a, pedestrians 116b, and other objects 116c such as animals, debris, and the like. The object models 114 may be defined using any 3D modeling format known in the art. In some embodiments, the object models 114 may be represented as a point cloud, a mesh of triangles, or other representations of the contours of the object. The object model 114 may further define material properties relevant to the detection of the real-world analog of the object model by one or more types of sensors. For example, for modeling detection by a camera, attributes such as color, texture, reflectivity, and the like may be specified for points on the surface of the object model 114. For modeling detection by a LIDAR sensor, the object model 114 may define reflectivity for points on the surface of the object model. For modeling detection by a RADAR sensor, properties may include reflectivity at a wavelength emitted according to the model 112c of the RADAR sensor.

The database 104 may further store a machine learning model 118 trained using simulated sensor data generated according to the methods disclosed herein. The machine learning model 118 may be trained for any purpose. For example, the machine learning model may be trained to detect obstacles, particularly obstacles for which detection is simulated according to the methods disclosed herein. The machine learning model 118 may be a deep neural network, Bayesian network, or other type of machine learning model.

In another example, a machine learning model 118 may be trained to estimate the contours of a location without objects when objects were present during detection of the scene. For example, a street may be detected using LIDAR without vehicles driving along it or parked beside it. An example application may include obtaining sensor data from an empty street, simulating sensing of models of vehicles along with the empty street according to the methods described herein, and then training the machine learning model 118 to generate a point cloud corresponding to the empty street by removing points corresponding to the added vehicles.

The server system 102 may execute a training engine 120. The training engine 120 may include a locator module 122*a*. The locator module 122*a* may be programmed to identify coordinates in a region of space including sensor data that are not currently occupied by an obstacle. As discussed below, this may include identifying a ground plane, e.g. a street, sidewalk, parking lot, or other surface.

The training engine 120 may include an insertion module 122*b*. The insertion module 122*b* selects locations for one or more object models 114 within one or more of the unoccupied regions identified by the locator module 122*a*. In some embodiments, the location may be specified manually by a user in order to create a desired scenario. In other embodiments, a location within one or more unoccupied regions may be randomly selected by the insertion module 122*b*. Also possible is a non-random automatically selected location (e.g., with an implemented model of a vehicle driver).

The training engine 120 may include a simulation module 122*c*. The simulation module 122*c* simulates both detection of an inserted object model 114 and adjustments to sensor data to be consistent with presence of the object model 114. As discussed below, this may include removing sensor data that would be obscured if the real-world analog of the object model 114 were actually present.

The training engine 120 may execute a training module 122*d* that trains a machine learning model 118 using sensor data modified according to the methods disclosed herein. As known in the art, a large amount of training data is required to train a machine learning model. Accordingly, many hundreds or thousands of sets of sensor data may be modified and used to train the machine learning model 118.

Figure 1B:
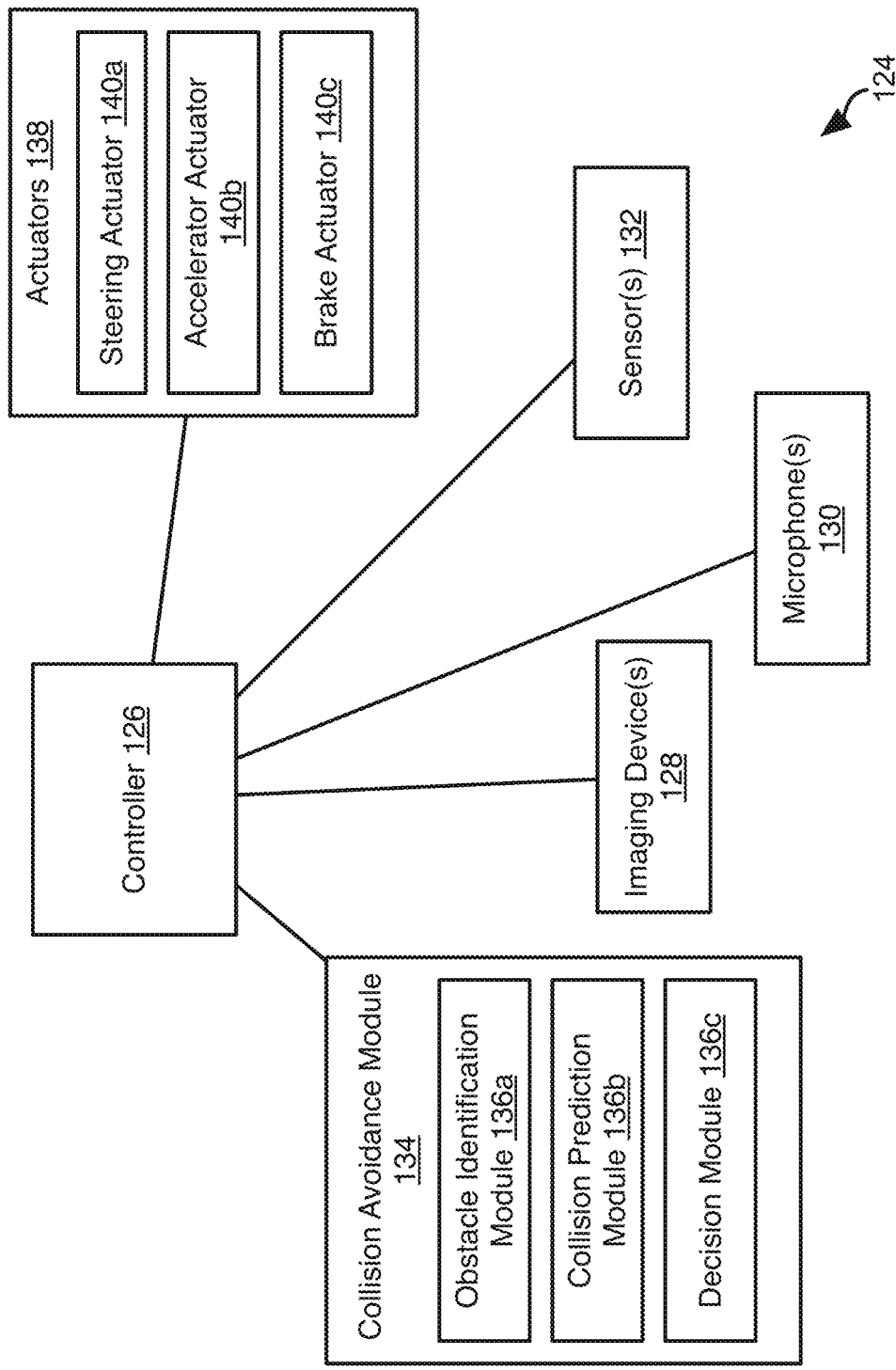

Referring to FIG. 1B, the machine learning model 118 may be used to perform obstacle detection in the illustrated system 124 that may be incorporated into a vehicle, such as an autonomous or human-operated vehicle. For example, the system 124 may include a controller 126 housed within a vehicle. The vehicle may include any vehicle known in the art. The vehicle may have all of the structures and features of any vehicle known in the art including, wheels, a drive train coupled to the wheels, an engine coupled to the drive train, a steering system, a braking system, and other systems known in the art to be included in a vehicle.

As discussed in greater detail herein, the controller 126 may perform autonomous navigation and collision avoidance. In particular, one or more of LIDAR data, image data, radar data, and one or more types of sensor data may be analyzed to identify obstacles.

The controller 126 may receive one or more image streams from one or more imaging devices 128. For example, one or more cameras may be mounted to the vehicle and output image streams received by the controller 126. The controller 126 may receive one or more audio streams from one or more microphones 130. For example, one or more microphones or microphone arrays may be mounted to the vehicle and output audio streams received by the controller 126. The microphones 130 may include directional microphones having a sensitivity that varies with angle.

In some embodiments, the system 124 may include other sensors 132 coupled to the controller 126, such as one or more of LIDAR, RADAR, SONAR, and ultrasound sensors or the like. The locations and orientations of the sensing devices 128, 130, 132 may correspond to those modeled in the sensor models 110 used to train the machine learning model 118.

The controller 126 may execute a collision avoidance module 134 that receives outputs of sensing devices 128, 130, 132, detects obstacles in the outputs, and takes action to avoid them. The collision avoidance module 134 may include or be embodied as the machine learning model 118 trained using modified sensor data generated according to the methods described herein. The collision avoidance module 134 may also be a programmed control system that is tuned or tested using augmented sensor data generated according to the method disclosed herein.

The collision avoidance module 134 may include an obstacle identification module 136*a* that receives outputs of the sensing devices 128, 130, 132 and outputs an estimate as to the location of an obstacle and possibly a classification of the obstacle (vehicle, pedestrian, structure, animal, etc.).

The collision avoidance module 134 may further execute a collision prediction module 136*b* predicts which obstacle images are likely to collide with the vehicle based on its current trajectory or current intended path. The collision prediction module 136*b* may evaluate the likelihood of collision with objects identified by the obstacle identification module 136*a*.

A decision module 136*c* may then make a decision to stop, accelerate, turn, etc. in order to avoid obstacles. The manner in which the collision prediction module 132*c* predicts potential collisions and the manner in which the decision module 132*d* takes action to avoid potential collisions may be according to any method or system known in the art of autonomous vehicles.

The decision module 136*c* may control the trajectory of the vehicle by actuating one or more actuators 138 controlling the direction and speed of the vehicle. For example, the actuators 138 may include a steering actuator 140*a*, an accelerator actuator 140*b*, and a brake actuator 140*c*. The configuration of the actuators 140*a*-140*c* may be according to any implementation of such actuators known in the art of autonomous vehicles.

Figure 2:
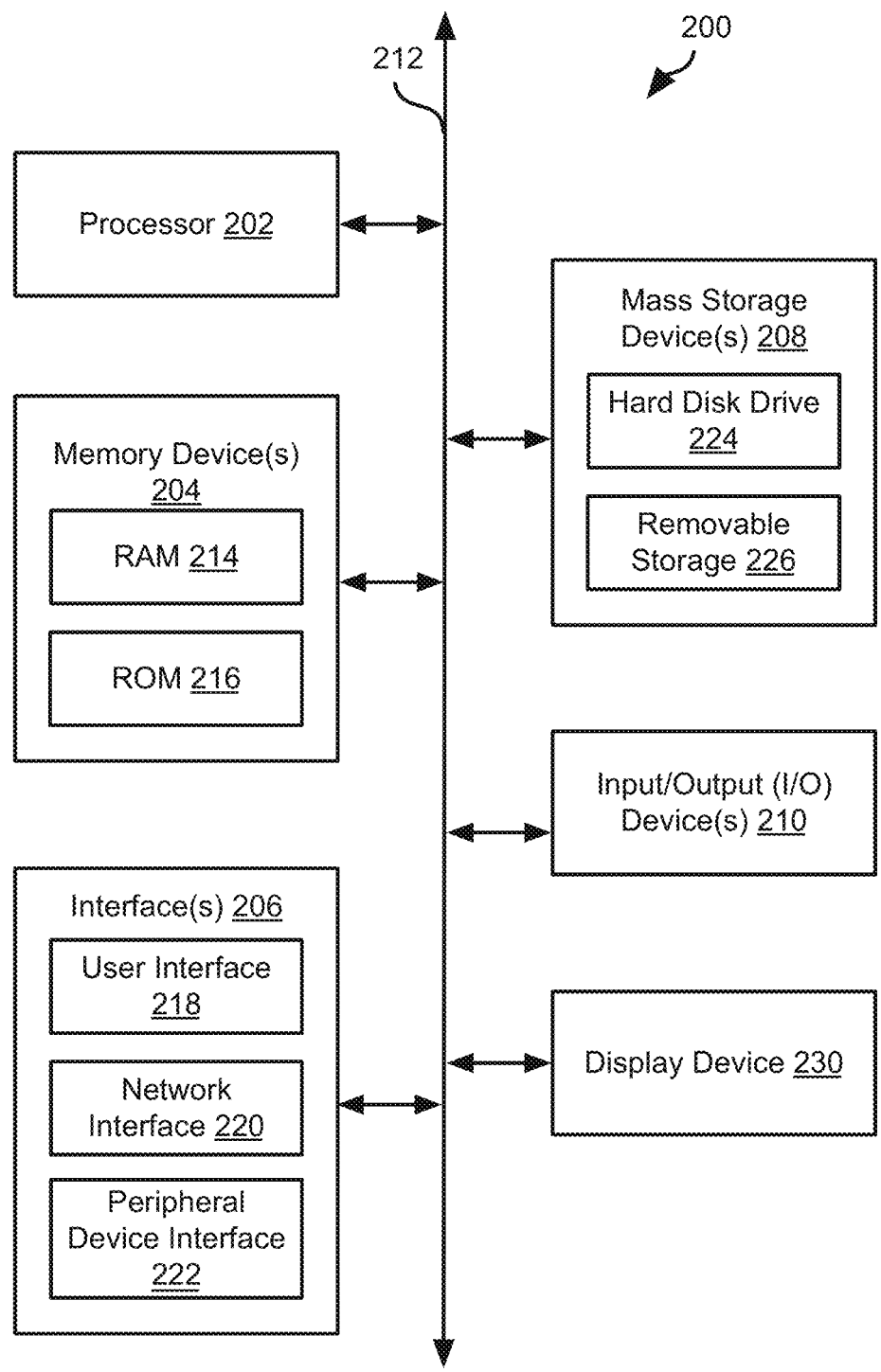
FIG. 2 is a schematic block diagram of an example computing device suitable for implementing methods in accordance with embodiments of the invention.

FIG. 2 is a block diagram illustrating an example computing device 200. Computing device 200 may be used to perform various procedures, such as those discussed herein. The server system 102 and controller 126 may have some or all of the attributes of the computing device 200.

Computing device 200 includes one or more processor(s) 202, one or more memory device(s) 204, one or more interface(s) 206, one or more mass storage device(s) 208, one or more Input/Output (I/O) device(s) 210, and a display device 230 all of which are coupled to a bus 212. Processor(s) 202 include one or more processors or controllers that execute instructions stored in memory device(s) 204 and/or mass storage device(s) 208. Processor(s) 202 may also include various types of computer-readable media, such as cache memory.

Memory device(s) 204 include various computer-readable media, such as volatile memory (e.g., random access memory (RAM) 214) and/or nonvolatile memory (e.g., read-only memory (ROM) 216). Memory device(s) 204 may also include rewritable ROM, such as Flash memory.

Mass storage device(s) 208 include various computer readable media, such as magnetic tapes, magnetic disks, optical disks, solid-state memory (e.g., Flash memory), and so forth. As shown in FIG. 2, a particular mass storage device is a hard disk drive 224. Various drives may also be included in mass storage device(s) 208 to enable reading from and/or writing to the various computer readable media. Mass storage device(s) 208 include removable media 226 and/or non-removable media.

I/O device(s) 210 include various devices that allow data and/or other information to be input to or retrieved from computing device 200. Example I/O device(s) 210 include cursor control devices, keyboards, keypads, microphones, monitors or other display devices, speakers, printers, network interface cards, modems, lenses, CCDs or other image capture devices, and the like.

Display device 230 includes any type of device capable of displaying information to one or more users of computing device 200. Examples of display device 230 include a monitor, display terminal, video projection device, and the like.

Interface(s) 206 include various interfaces that allow computing device 200 to interact with other systems, devices, or computing environments. Example interface(s) 206 include any number of different network interfaces 220, such as interfaces to local area networks (LANs), wide area networks (WANs), wireless networks, and the Internet. Other interface(s) include user interface 218 and peripheral device interface 222. The interface(s) 206 may also include one or more peripheral interfaces such as interfaces for printers, pointing devices (mice, track pad, etc.), keyboards, and the like.

Bus 212 allows processor(s) 202, memory device(s) 204, interface(s) 206, mass storage device(s) 208, I/O device(s) 210, and display device 230 to communicate with one another, as well as other devices or components coupled to bus 212. Bus 212 represents one or more of several types of bus structures, such as a system bus, PCI bus, IEEE 1394 bus, USB bus, and so forth.

For purposes of illustration, programs and other executable program components are shown herein as discrete blocks, although it is understood that such programs and components may reside at various times in different storage components of computing device 200, and are executed by processor(s) 202. Alternatively, the systems and procedures described herein can be implemented in hardware, or a combination of hardware, software, and/or firmware. For example, one or more application specific integrated circuits (ASICs) can be programmed to carry out one or more of the systems and procedures described herein.

Figure 3:
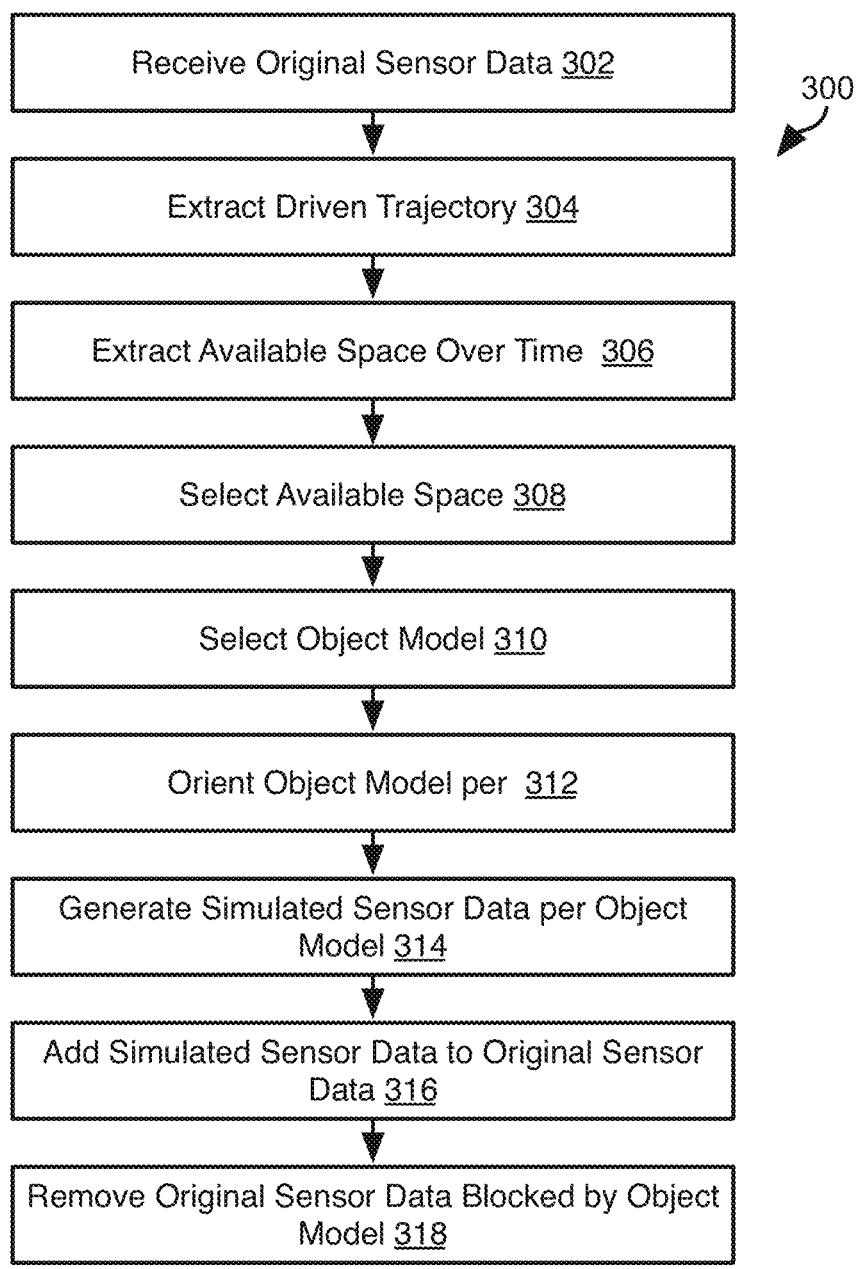
FIG. 3 is a process flow diagram of a method for adding simulated sensor output for an object model to actual sensor data in accordance with an embodiment of the present invention.

Referring to FIG. 3, the illustrated method 300 may be executed by the server system 102 in order to generate simulated sensor data for training purposes. Augmented sensor data may also be used for testing and validation of control algorithms or other types of systems or methods. In another example, the augmented sensor data may be used to test or validate a detection algorithm for sensing objects using sensor data. The detection algorithm may be tested alone or in combination with a control algorithm that makes decisions based on outputs of the detection algorithm. The method 300 may include receiving 302 original sensor data. The original sensor data may include a series of sensor outputs over a time period that are received from actual sensors of a vehicle while traversing a trajectory. The sensor data will therefore include data indicating sensor perception of commonly encountered structures such as one or more of streets, buildings, other vehicles, pedestrians, animals, debris, etc.

The output of each sensor will include a series of data sets, each data set in the series representing outputs of the sensor at one point in time or for one period of the sensor's refresh rate. Where multiple sensors are used the original sensor data will include a series of data sets for each sensor, which may have same or different refresh rates or sampling rates.

The method 300 may include extracting 304 a driven trajectory of the vehicle. This may include receiving a series of GPS (global positioning system) coordinates from the original sensor data 302. The GPS coordinates may be time stamped or be recorded at a known sampling rate such that the time associated with each coordinate is known and can be related to outputs of other sensors at that same time (i.e., closest to that time where sampling/refresh rates are unequal or misaligned). The extraction of the trajectory may also be defined by an algorithm that utilizes data from one more sensors over time to define the driven trajectory. Known concepts for this purpose are e.g. Odometry, SLAM or Structure from Motion.

The method 300 may further include extracting 306 available space over time. This may include identifying portions of an environment of the vehicle that captured the original sensor data that is not occupied. For example, for LIDAR data, points in a point cloud may be in, or relatable to, the orientation of the vehicle. Accordingly, a height of a point relative to the vertical axis of the vehicle is known. Those points that are above a specified threshold height may be determined to be potential height, but points below this threshold may be determined likely to be a ground plane, e.g. road surface. Areas of points below the threshold may then be identified. Clusters of contiguous points encompassing an area that does not include any above-threshold points may be determined to be unoccupied areas. In other examples, free space is not constrained to be at ground level. For example, a bird, drone, overhanging branch, vehicles or people that are in motion due to accident, or other structure could be positioned in free space above the ground. Accordingly, available space may be identified as a volume of space without points above the threshold. The threshold may be application dependent, e.g., be higher where the object to be added is not resting on the ground.

Note that the vertical height of points above a horizontal plane may be defined with reference to the horizontal plane of the vehicle rather than a plane perpendicular to the direction of gravity. In this manner, when the vehicle is positioned on a hill, points on the hill will not be incorrectly interpreted as being above the threshold.

Inasmuch as the sensor data includes a series of data sets, available space may be extracted from an individual data set or a plurality of consecutive data sets.

In the case of visual data, colors and textures of an image may be analyzed to identify available space, such as the color and texture of concrete, asphalt, gravel, or other driving surface may be identified as free space. Portions of an image including objects identifiable as vehicles, buildings, pedestrians, animals etc. may be excluded from the available spaces. Where 3D imaging system may use images from multiple cameras to construct a 3D model from one or more 2D images, the 3D position of these available spaces may be determined from the 3D model. In some embodiments, sensor fusion may be used to combine insight from LIDAR points to create an actual 3D scene combined with the imagery. In such embodiments, the free space may be identified based on the color of a region of the 3D scene (asphalt, concrete, etc.) and the height of the points in the scene as outlined above with respect to LIDAR data.

The method 300 may include selecting 308 an available space from among those identified at step 306. For example, the GPS coordinates of the trajectory may be mapped to the coordinate system of a point cloud of a LIDAR system or 3D imaging system. An available space may be selected due to the space lying on the trajectory. In many applications, step 308 may be performed manually and may simply include receiving a user selection of an available space identified at step 306. For example, sensor data may be graphically represented having the available spaces highlighted and associated with user interface elements that are selectable in order to receive a user selection of an available space.

The method 300 may further include selecting 310 an object model. For example, for the space selected at step 308, an object model may be automatically selected that has a footprint less than or equal to the space. Accordingly, the object models 114 may include dimensions of a footprint of the object model to enable this comparison. As for step 308, step 310 may also be performed manually by receiving a user selection of an object model 114 from a collection of multiple object models 114.

Steps 312-318 may be performed repeatedly for different data sets corresponding to different time steps in order to provide a series of augmented data sets that may be used to train the machine learning model. Steps 312-318 may be performed for outputs of multiple sensors as well.

The method 300 may further include orienting 312 the object model 114 within the coordinate system of the original sensor data. For example, for the area selected at step 308, a plane may be fitted to the points in the data set in which the selected area was identified. The object may then be oriented such that a base of the object model is parallel to and co-located with that plane, e.g. the bottom of the tires of a vehicle, the feet of a model of a pedestrian or animal, etc. The location of the object model 114 within the selected space may be selected to lie on the trajectory of step 304 such that the vehicle would have collided with the object model 114 if it were actually present.

As noted above, the original sensor data may include multiple data sets at multiple points in time. Accordingly, step 312 may be performed for multiple data sets such that the object is oriented 312 with respect to the coordinate system of each data set in a consistent matter with either a stationary object or an object moving consistently with its real-world analog, e.g., walking speed for a pedestrian, driving speeds for a vehicle, etc. For example, as noted above, the coordinate system of each data set may be related to the GPS coordinates of the vehicle. Accordingly, the GPS coordinate of the vehicle closest in time to each data set (or approximated for the each data set by interpolation) may be used to transform the orientation of the object model from one data set to the next to simulate a stationary object or an object moving according to a desired trajectory relative to the trajectory of the vehicle.

The method 300 may then include generating 314 a simulated sensor output simulating perception of the object model from a point of view of a sensor of the vehicle. This may include using the corresponding sensor model 110 to simulate perception of the object model at the location and orientation from step 312. For example, for LIDAR, a point cloud conforming to the surface of the object model may be generated where the density of the points and the reflectivity is determined according to the sensor model 112b of the LIDAR sensor.

In another example, a rendering of the object model at its location and orientation from step 312 may be generated 314. The technique by which this is performed may include using any computer animation technique known in the art, such that as those that are often employed in adding computer generated images for movies and television. In particular, lighting of the original scene may be approximated to simulate illumination of the object model 114 and provide a realistic rendering. Also the 3D environment (including local lights) may be used to create sophisticated shadows. For example, 3D data from LIDAR point clouds and camera data may be used to detect structures and calculate shadows that would be cast by such structures as well as the object model. Locations of lights and structures that may cast shadows may be obtained from pre-existing 3D maps of a region as well.

In yet another example, reflection and detection of a radio wave from a RADAR sensor may be simulated for the object model at the position and orientation from step 312 according to the RADAR sensor model 112c.

The method 300 may then include adding 316 the simulated sensor data to the original sensor data 302 to obtain augmented sensor data. Note that any number of objects may be inserted into a scenario and corresponding sensor data may be added to the original sensor data. For LIDAR, this may include adding the point cloud for the object model to the point cloud of a given frame of data, i.e. the frame of data analyzed at steps 306-312. For RADAR, the reflections of RADAR signals simulated at step 314 may be added to reflections in the original sensor output for a given time step. For image data, the rendering of the object model may be superimposed on an image or added to a 3D Model obtained from images for a given time step.

The method 300 may further include removing 318 original sensor data that would have been blocked by the object model if it were present. One advantage of RADAR is that the waves can even travel "through" objects (e.g., between the ground and the lower end of the car), so an object behind another one is not necessarily hidden for a RADAR device where it would be for LIDAR or a camera (though windows may provide visibility through objects). Accordingly, for RADAR data, these properties of RADAR waves may be simulated when determining whether original data is in fact blocked. In instances where multiple objects are added, the original data blocked by each may be determined. Portions of simulated data for object models that are blocked by other added object models may also be calculated and removed. Alternatively, at step 314, simulation of sensing of an added object model may be performed with multiple object models having their relative orientation and positioning from steps 308 and 310. In this manner, any blocking will be taken into account in the simulation of sensing the group of object models.

This process and the other steps of the method 300 may be understood with reference to FIGS. 4A and 4B and FIGS. 5A and 5B. The augmented sensor data with the data removed according to step 318 may then be output and used for training purposes or any other application for which it may be beneficial.

Figure 4A:
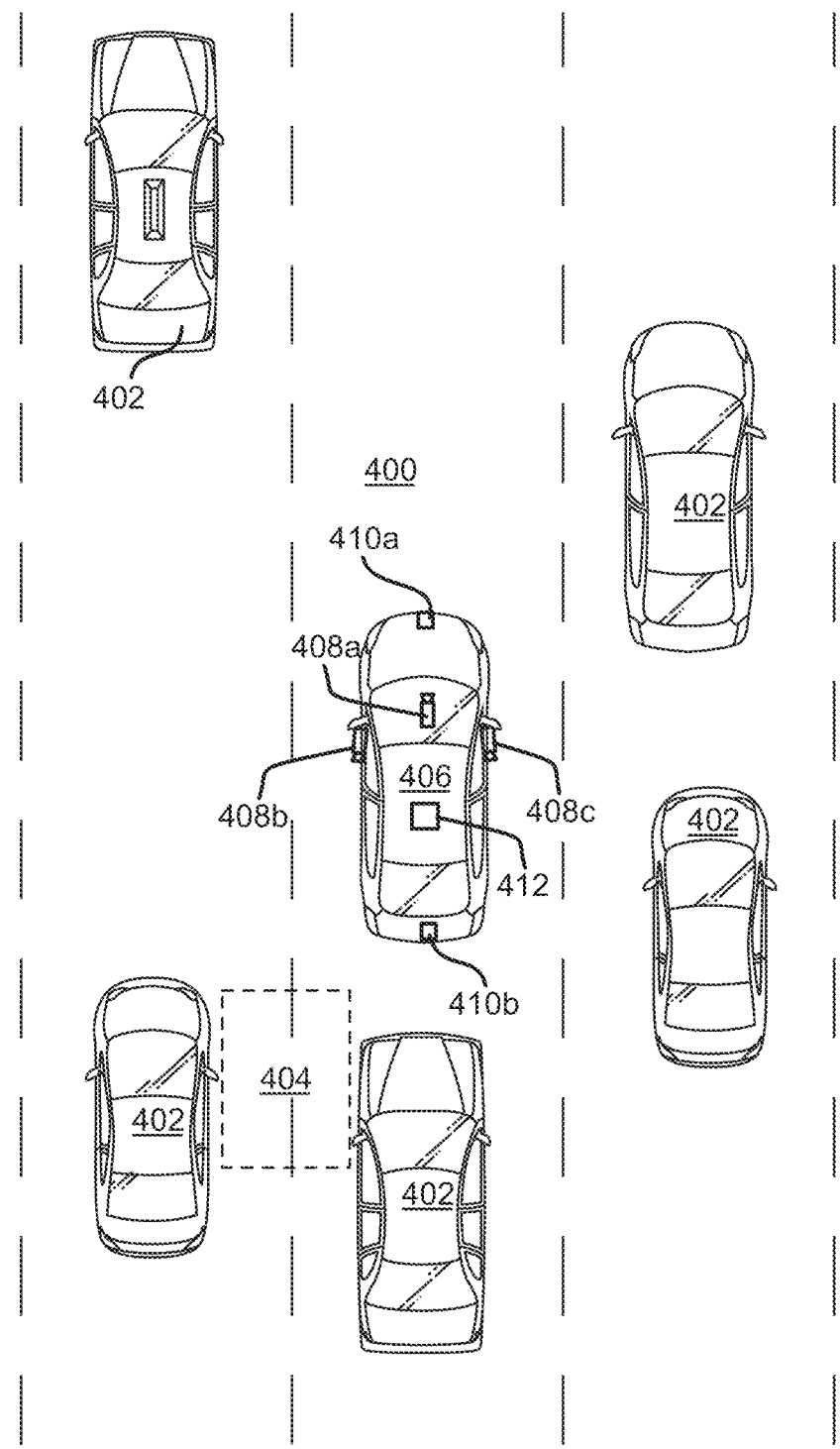
FIGS. 4A and 4B are schematic block diagrams of a scenario sensed using actual sensors.
Figure 4B:
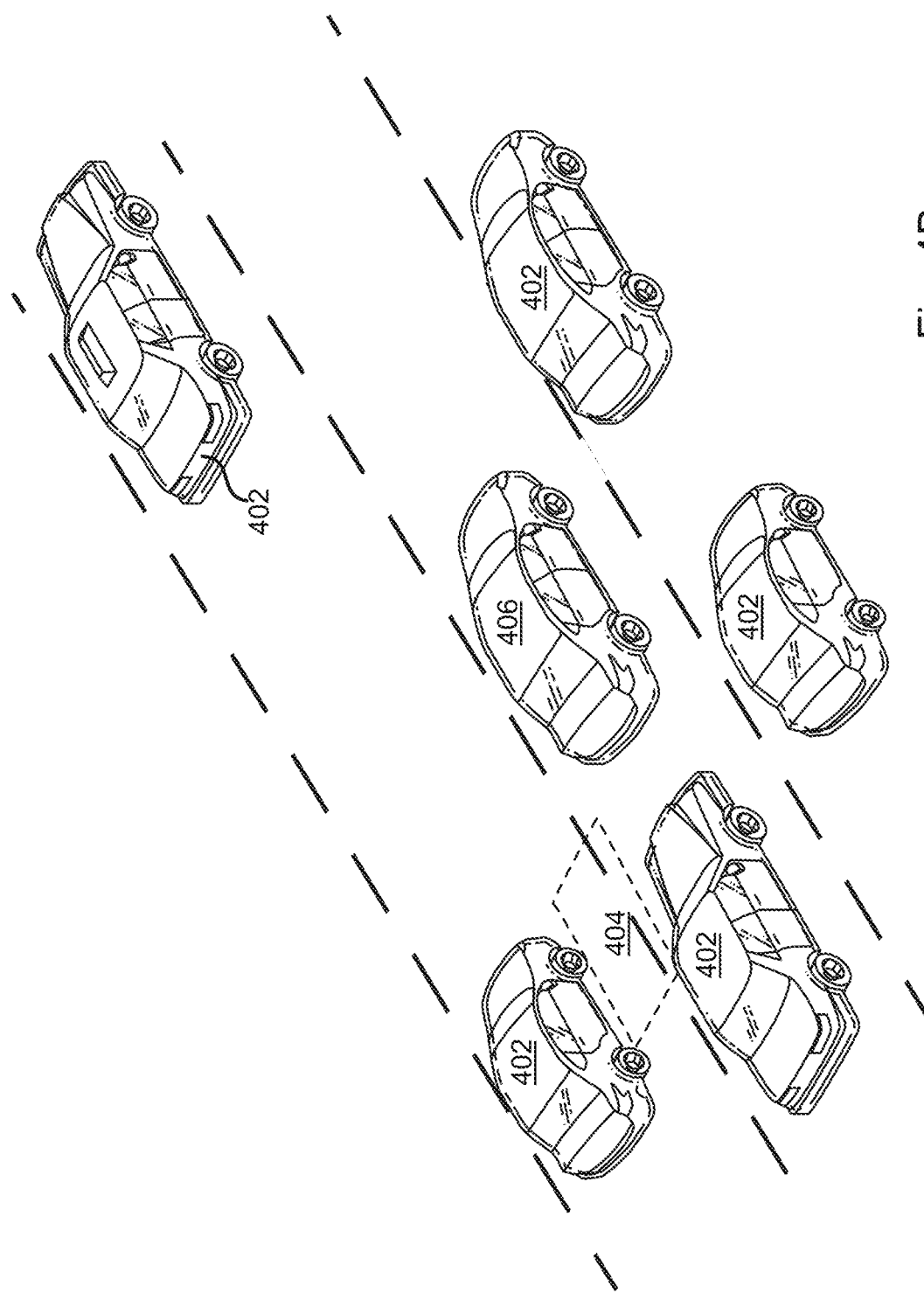

As shown in FIG. 4A, a typical driving scenario includes a road 400 with a plurality of vehicles 402 occupying regions the road 400 and one or more areas 404 that are unoccupied. A subject vehicle 406, i.e. the vehicle sensing the scenario, is located on the road 400 and senses the scenario, including the other vehicles 402 using sensors such cameras 408a-408c, RADAR sensors 410a-410b, and a LIDAR sensor 412. Other sensors may also be used such as microphones, ultrasonic sensors, and the like.

Figure 5A:
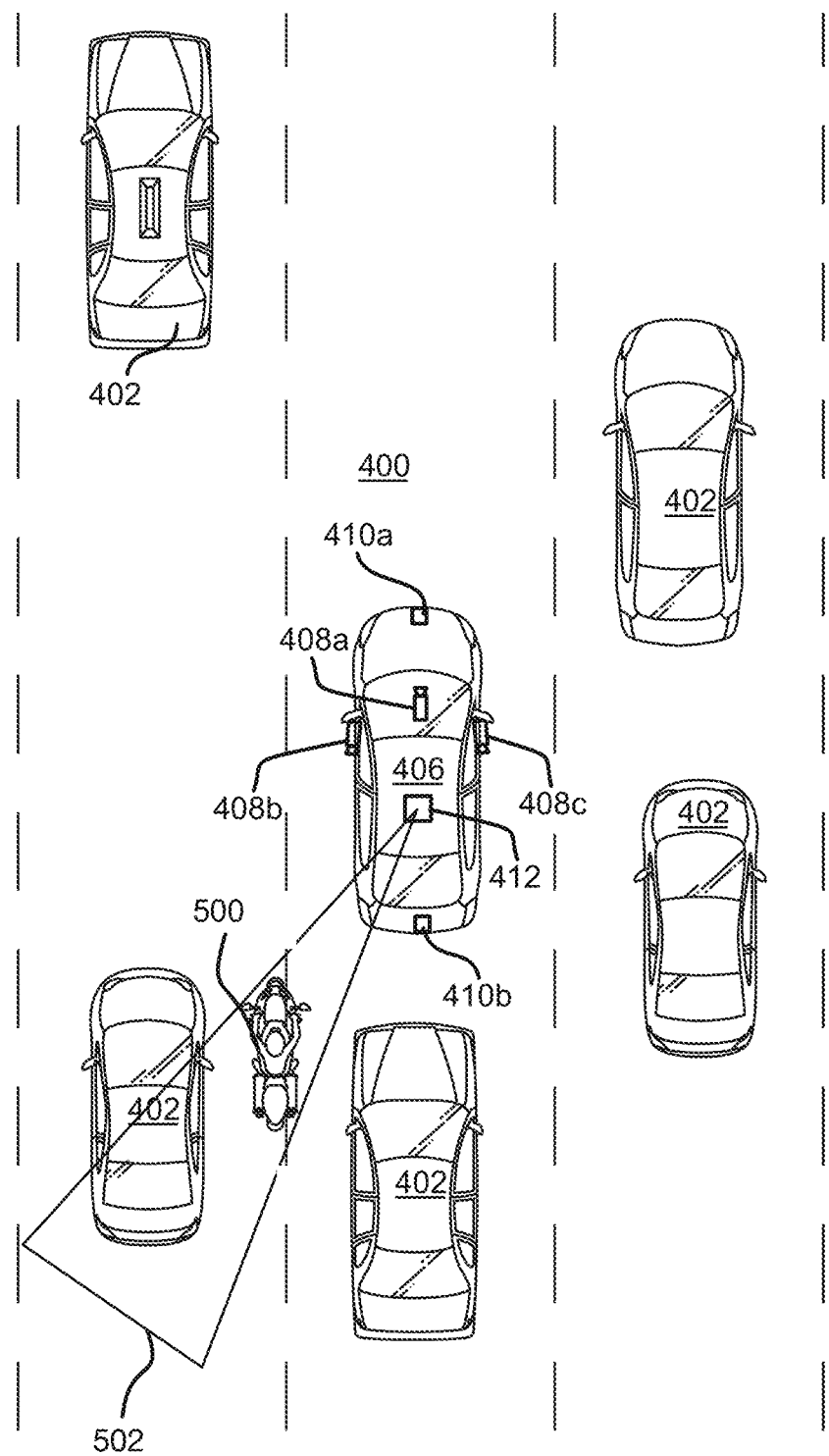
FIGS. 5A and 5B illustrate augmentation of the sensor data for FIGS. 4A and 4B in accordance with an embodiment of the present invention.
Figure 5B:
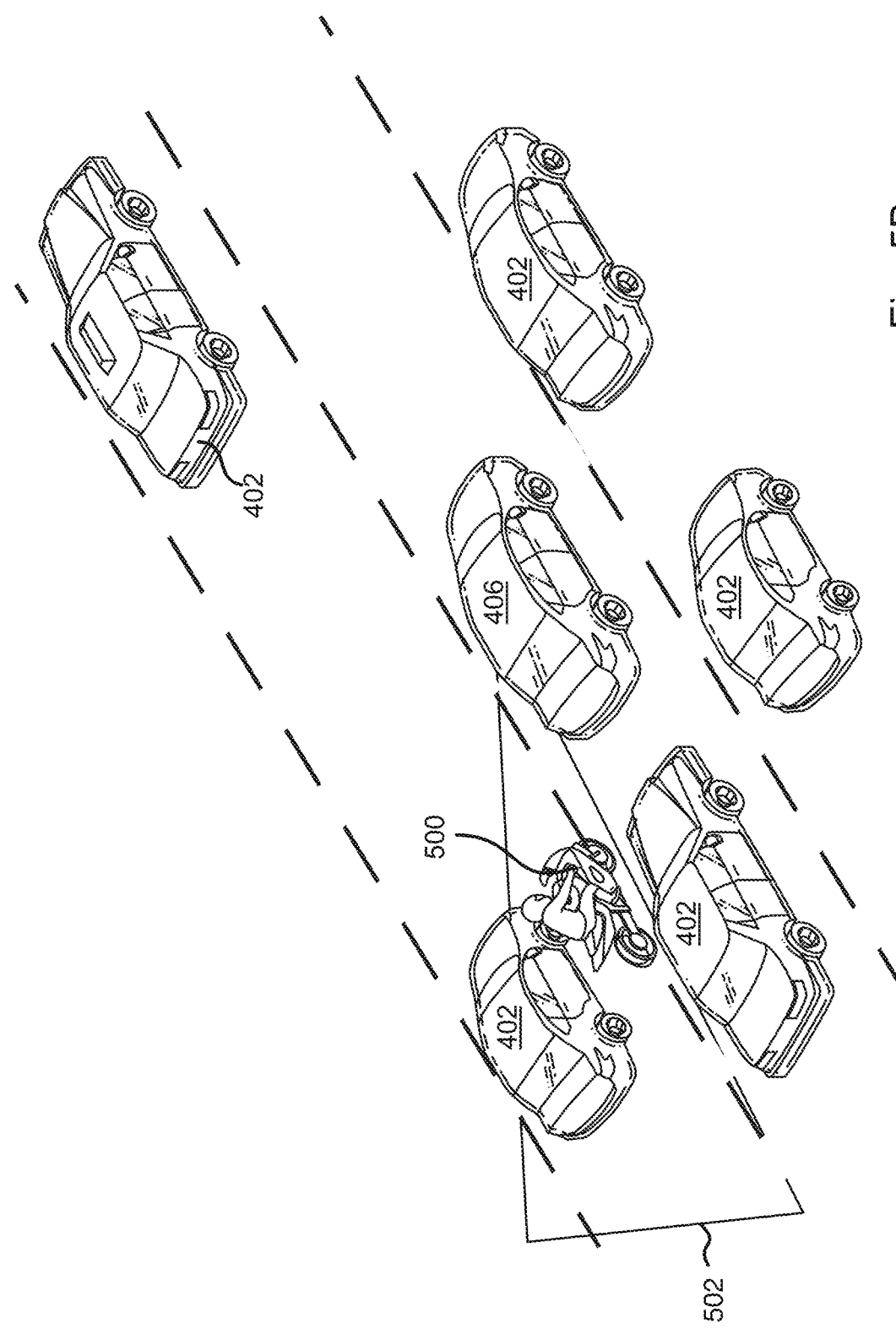

Referring to FIGS. 5A and 5B, in the illustrated example, an object model 500 of a motorcyclist that is lane splitting may be added to the unoccupied area 404. Other example positions include in front of the subject vehicle 406 such that the object model 500 would be struck if it were actually present. Simulated perception of the object model 500 by one or more of the sensors 408a-408c, 410b, 412 may then be performed based on models of these sensors and the locations of these sensors on the subject vehicle 406.

As is apparent in FIGS. 5A and 5B, the object model 500 is interposed between some of the sensors 408a-408c, 410b, 412 and one of the other vehicles 402. Accordingly, sensor outputs corresponding to the blocked vehicle may be removed from the sensor outputs in the manner described above. In some embodiments, to reduce computational requirements, blocked sensor data may be evaluated within a cone 502 originating at a location of a sensor (LIDAR sensor 412 in the illustrated example) and bounding the object model 500. As shown in FIG. 5A, the cone may be conical or frustoconical and may be sized such that the object model 500 lies completely within the cone 502. For example, the included angle of the cone 502 may be selected such that the cone 502 is tangent to the object model 500 at one or more points with no points of the object model 500 being outside of the cone 502.

Sensor data having coordinates within the cone 502 and that are roughly behind the object may then be evaluated to determine whether that point would be detectable with the object model 500 present. For example, in one implementation, one may define a 3D cylinder around the object in addition to the cone 502. Only those points which are either inside the cylinder or behind it relative to the vehicle are then evaluated for removal.

If not, a point is found not to be detectable. The point may then be removed from the augmented sensor data. As described below, the object model 500 may be represented as a set of triangles. A ray emanating from the sensor location to a point in the original sensor data may be evaluated to determine whether the ray intersects one of these triangles. If so, then the point may be eliminated from the augmented sensor data. This approach is useful for LIDAR data and for determining which pixels to cover for use with a 3D image generated from images or a combination of one or more images and LIDAR data. For RADAR data, simulation of propagation of RADAR waves around the inserted object model may be performed to determine whether reflections from the original sensor data would receive transmitted waves and whether reflections could still reach the sensor.

Figure 6:
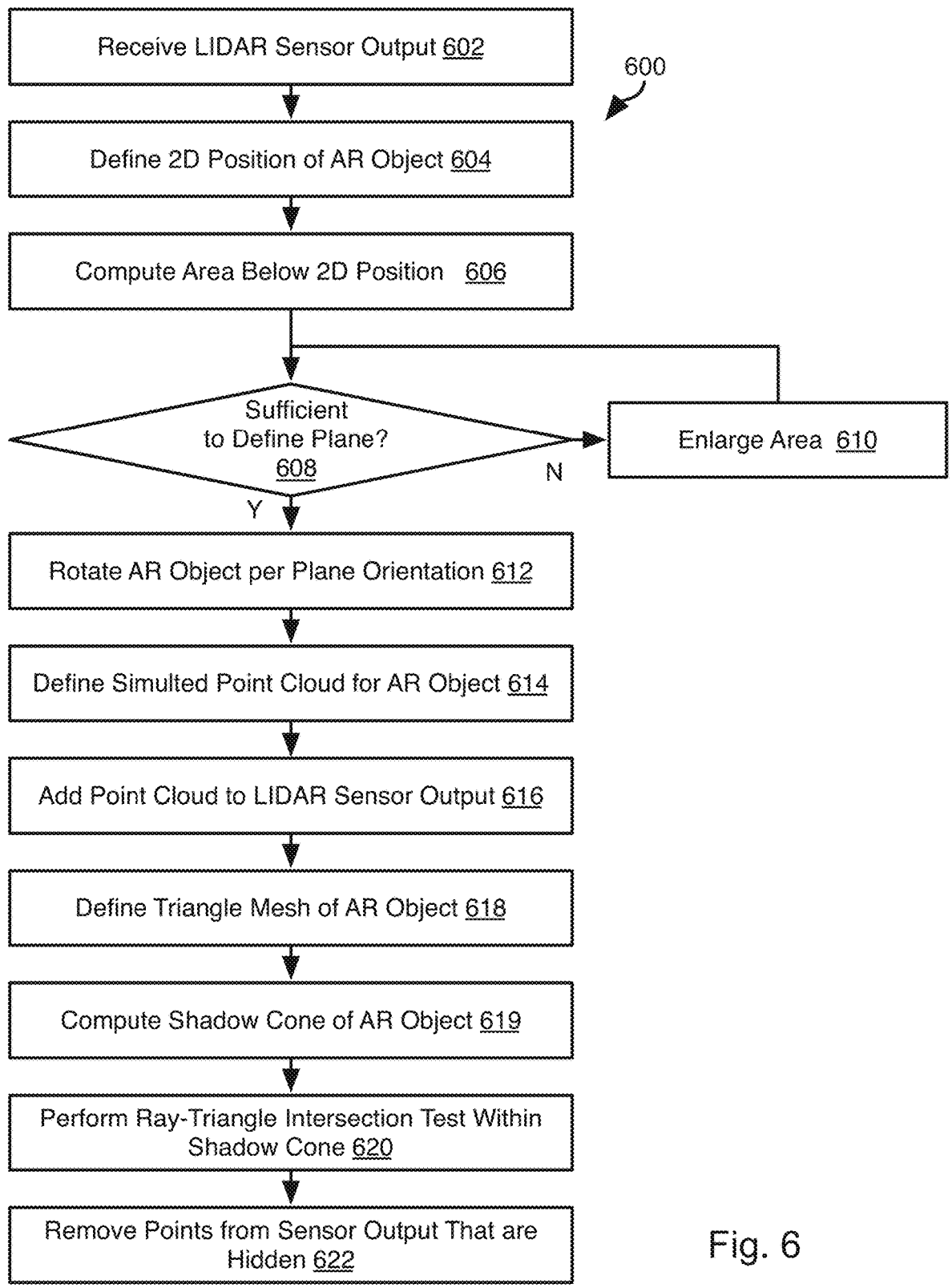
FIG. 6 is a process flow diagram of a method for augmenting LIDAR data according to an object model in accordance with an embodiment of the present invention.

Referring to FIG. 6, the illustrated method 600 is a more detailed application of the method 300 that is particularly suited for LIDAR sensor data. The method 600 may be executed for each frame of LIDAR data over a period of time. As described above, the location of an object model may be adjusted for each iteration of the method 600 to simulate a stationary object or to simulate a desired trajectory for the object model.

The method 600 may include receiving 602 original LIDAR sensor output in the same manner as step 302 of the method 300. The method 600 may further include selecting a 2D position of an augmented reality (AR) object model. In a typical LIDAR system, two of the coordinate axes (X, Y) are parallel to the horizontal plane of the vehicle, e.g. a parallel to a flat surface supporting the vehicle. Accordingly, step 604 includes selecting X and Y coordinates (dx, dy) for placement of the AR (augmented reality) object model. As noted above with respect to step 308, this process may be automated or may be performed manually. For example, the coordinates dx, dy may be selected from among available spaces identified in the manner described above with respect to steps 304-308.

In instances where the AR object model is not placed on the ground, other parameters may be received from a user or automatically selected such as a vertical position (dz) along the Z axis and an orientation, e.g. to simulate an airborne object.

The method 600 may include computing 606 an area below the AR object. For example, this may include identifying dimensions of a rectangle within which all of the X and Y coordinates of points on the AR object will fit. The method 600 may then include evaluating 608 whether this area includes sufficient points to define a plane. Specifically, whether there are sufficient points in the LIDAR point cloud having X and Y coordinates within this rectangle centered on the 2D position selected at step 604.

The number of points sufficient to define a plane may be a predetermined value specified by a designer. The number that is sufficient depends on the approach used to fit the plane. Any approach for finding a plane to approximate an array of points may be used such as the least squares, RANSAC (Random Sample Consensus) algorithm, Hough transform, or other approach known in the art. For example, three points is sufficient to define a plane. However, many times this number may be required to improve accuracy, such as a number from 6 to 300.

If the number of points is insufficient, the area may be incrementally enlarged 610 according to a predefined increment amount or percentage until the number of points is found 608 to be sufficient to accurately define the plane of the area.

The method 600 may then include rotating 612 the AR object model such that it is oriented correctly with respect to a plane approximated using the area computed at steps 606-610 using any of the plane definition techniques outlined above. In particular, the AR object model may define a local coordinate system defining a horizontal plane. A transformation to the AR object model may be applied such that the horizontal plane is parallel to the plane of the area from steps 606-610. The AR object model may define a reference point, such as a center point in the local horizontal plane of the model or some other predefined point. This point may be positioned at the 2D position from step 604 at step 612.

The method 600 may further include defining 614 a simulated point cloud for the AR object located at the position from step 604 and in the orientation of step 614 relative to the vehicle when the original LIDAR sensor output was captured. This may include simulating scanning of the AR object model using the point density, wavelength, and other properties of the LIDAR sensor model 112b and the reflectivity and dimensions of the AR object model (see description of Object Models 114, above). The points of the point cloud from step 614 may be added 616 to the original LIDAR sensor output to obtain an augmented sensor output.

A triangle mesh may also be defined 618 for the AR object model. The triangle mesh defines triangles having as vertices points on the surface of the AR object model. These points may be points of the AR object model itself or points of the point cloud from step 616. This mesh can be computed automatically, such as a greedy surface triangulation algorithm, or other approach known in the art.

The method 600 may further include computing 619 a shadow cone of the AR object model. As described above with respect to the method 300 this may include defining a frustoconical shape that is tangent to points of the AR object model but such that no points of the AR object model are outside of the frustoconical shape. For points of the original LIDAR sensor output 602 within the shadow cone, the method may include performing 620 a ray-triangle intersection test. In particular, if a line extending from a location of a sensor to a point passes through one of the triangles of the AR object model, that point will be removed 622 from the augmented sensor output.

Figure 7A:
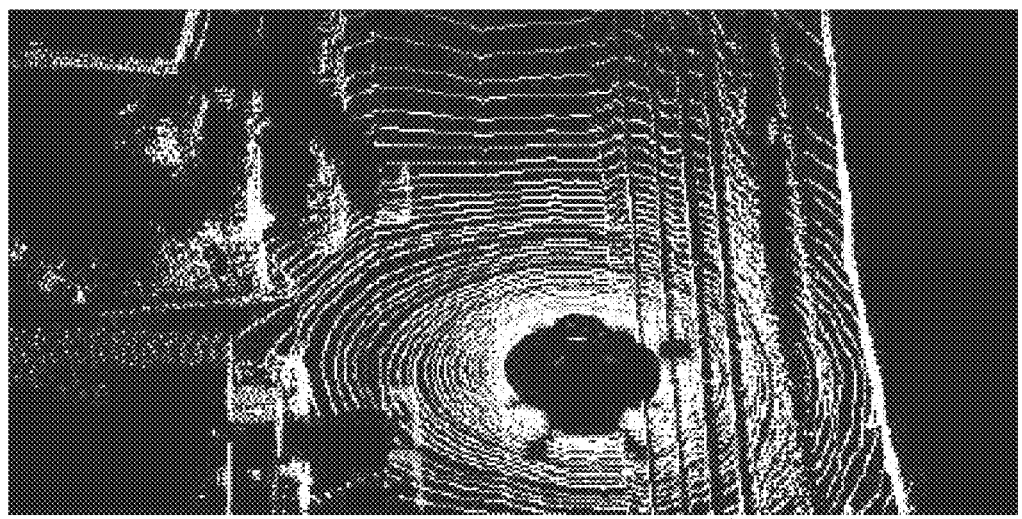
FIGS. 7A to 7C are images illustrating augmenting of LIDAR data according to the method of FIG. 6.
Figure 7B:
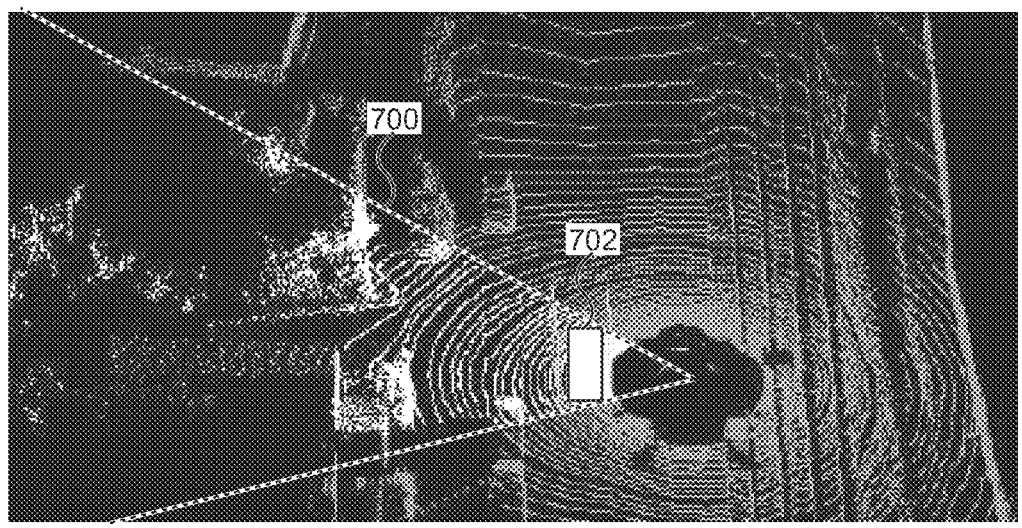
Figure 7C:
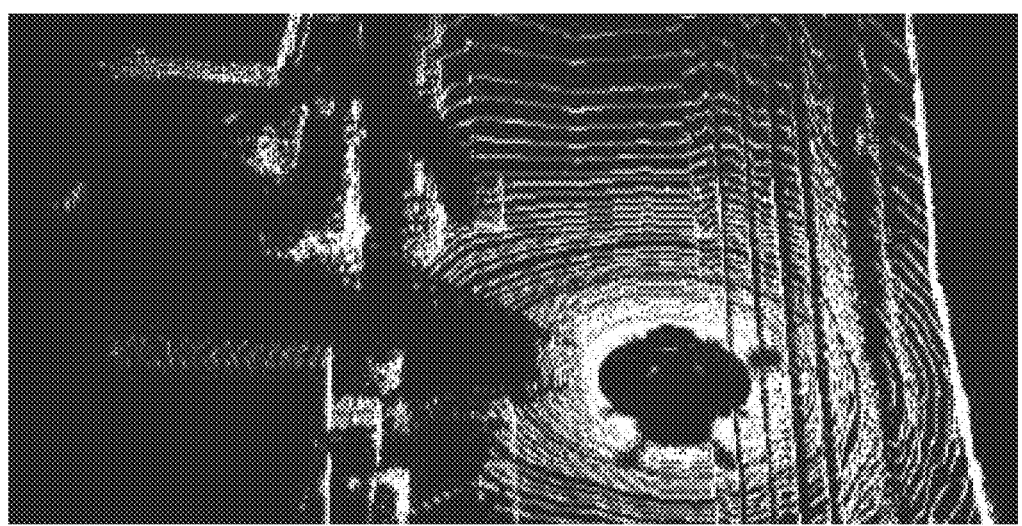

FIGS. 7A to 7C illustrate an example use of the method 600. FIG. 7A illustrates the original LIDAR sensor output. FIG. 7B illustrates the shadow cone 700 of an AR Object model 702 superimposed on the original LIDAR sensor output. FIG. 7C illustrates the final augmented sensor output in which a simulated point cloud for the object model 702 has been added and points in the shadow cone 700 have been removed.

In the above disclosure, reference has been made to the accompanying drawings, which form a part hereof, and in which is shown by way of illustration specific implementations in which the disclosure may be practiced. It is understood that other implementations may be utilized and structural changes may be made without departing from the scope of the present disclosure. References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Implementations of the systems, devices, and methods disclosed herein may comprise or utilize a special purpose or general-purpose computer including computer hardware, such as, for example, one or more processors and system memory, as discussed herein. Implementations within the scope of the present disclosure may also include physical and other computer-readable media for carrying or storing computer-executable instructions and/or data structures. Such computer-readable media can be any available media that can be accessed by a general purpose or special purpose computer system. Computer-readable media that store computer-executable instructions are computer storage media (devices). Computer-readable media that carry computer-executable instructions are transmission media. Thus, by way of example, and not limitation, implementations of the disclosure can comprise at least two distinctly different kinds of computer-readable media: computer storage media (devices) and transmission media.

Computer storage media (devices) includes RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other medium which can be used to store desired program code means in the form of computer-executable instructions or data structures and which can be accessed by a general purpose or special purpose computer.

An implementation of the devices, systems, and methods disclosed herein may communicate over a computer network. A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links, which can be used to carry desired program code means in the form of computer-executable instructions or data structures and which can be accessed by a general purpose or special purpose computer. Combinations of the above should also be included within the scope of computer-readable media.

Computer-executable instructions comprise, for example, instructions and data which, when executed at a processor, cause a general purpose computer, special purpose computer, or special purpose processing device to perform a certain function or group of functions. The computer executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the disclosure may be practiced in network computing environments with many types of computer system configurations, including, an in-dash vehicle computer, personal computers, desktop computers, laptop computers, message processors, handheld devices, multi-processor systems, microprocessor-based or programmable consumer electronics, network PCs, minicomputers, mainframe computers, mobile telephones, PDAs, tablets, pagers, routers, switches, various storage devices, and the like. The disclosure may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Further, where appropriate, functions described herein can be performed in one or more of: hardware, software, firmware, digital components, or analog components. For example, one or more application specific integrated circuits (ASICs) can be programmed to carry out one or more of the systems and procedures described herein. Certain terms are used throughout the description and claims to refer to particular system components. As one skilled in the art will appreciate, components may be referred to by different names. This document does not intend to distinguish between components that differ in name, but not function.

It should be noted that the sensor embodiments discussed above may comprise computer hardware, software, firmware, or any combination thereof to perform at least a portion of their functions. For example, a sensor may include computer code configured to be executed in one or more processors, and may include hardware logic/electrical circuitry controlled by the computer code. These example devices are provided herein purposes of illustration, and are not intended to be limiting. Embodiments of the present disclosure may be implemented in further types of devices, as would be known to persons skilled in the relevant art(s). At least some embodiments of the disclosure have been directed to computer program products comprising such logic (e.g., in the form of software) stored on any computer useable medium. Such software, when executed in one or more data processing devices, causes a device to operate as described herein.

Computer program code for carrying out operations of the present invention may be written in any combination of one or more programming languages, including an object-oriented programming language such as Java, Smalltalk, C++, or the like and conventional procedural programming languages, such as the "C" programming language or similar programming languages. The program code may execute entirely on a computer system as a stand-alone software package, on a stand-alone hardware unit, partly on a remote computer spaced some distance from the computer, or entirely on a remote computer or server. In the latter scenario, the remote computer may be connected to the computer through any type of network, including a local area network (LAN) or a wide area network (WAN), or the connection may be made to an external computer (for example, through the Internet using an Internet Service Provider).

The present invention is described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions or code. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a non-transitory computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

While various embodiments of the present disclosure have been described above, it should be understood that they have been presented by way of example only, and not limitation. It will be apparent to persons skilled in the relevant art that various changes in form and detail can be made therein without departing from the spirit and scope of the disclosure. Thus, the breadth and scope of the present disclosure should not be limited by any of the above-described exemplary embodiments, but should be defined only in accordance with the following claims and their equivalents. The foregoing description has been presented for the purposes of illustration and description. It is not intended to be exhaustive or to limit the disclosure to the precise form disclosed. Many modifications and variations are possible in light of the above teaching. Further, it should be noted that any or all of the aforementioned alternate implementations may be used in any combination desired to form additional hybrid implementations of the disclosure.

The invention claimed is:

1. A method comprising, by a computing device:
receiving an original point cloud from a LIDAR (light detection and ranging) sensor of a controller of a vehicle;
identifying available space in the original point cloud;
placing an object model at a location in the available space; and
obtaining an augmented point cloud by modeling sensing of the object model by the LIDAR sensor and adding a simulated point cloud to the original point cloud.

2. The method of claim 1, further comprising:
identifying, by the computing device, obscured points of the original point cloud such that the object model would be positioned between the obscured points and the LIDAR sensor; and
removing, by the computing device, the obscured points from the point cloud.

3. The method of claim 2, further comprising:
defining, by the computing device, a shadow cone of the object model with respect to a location of the LIDAR sensor on the vehicle;
defining, by the computing device, a triangle mesh version of the object model;
searching, by the computing device, for the obscured points only within the shadow cone; and
identifying, by the computing device, the obscured points as being located such that a ray extending from each point of the obscured points to the location of the LIDAR sensor intersects at least one triangle of the triangle mesh.

4. The method of claim 1, further comprising:
identifying, by the computing device, a two dimensional area of the available space around the location;
fitting, by the computing device, a plane to points of the original point cloud within the two-dimensional area; and
transforming, by the computing device, the object model according to an orientation of the plane.

5. The method of claim 4, further comprising:
identifying the two-dimensional area as being covered by the object model;
determining (a) that the two-dimensional area covers insufficient points of the original point cloud to define the plane; and
in response to determining (a), expanding the two-dimensional area until the area covers sufficient points of the point cloud to fit the plane.

6. The method of claim 1, wherein identifying the available space around the vehicle in the sensor data comprises:
evaluating a Z coordinate of X, Y, and Z coordinates defining each point of the original point cloud; and
identifying as the available space those regions in which the Z coordinate of points in the original point cloud within the regions are less than a threshold height.

7. The method of claim 6, wherein the Z coordinates of the original point cloud are measured perpendicular to a horizontal plane of the vehicle.

8. The method of claim 1, further comprising, testing at least one of a control algorithm and a detection algorithm according to the augmented point cloud.

9. The method of claim 1, further comprising training a machine learning model to detect obstacles according to the augmented point cloud.

10. The method of claim 1, further comprising training a machine learning model to remove objects from LIDAR sensor data according to the augmented point cloud.

11. A system comprising one or more processing devices and one or more memory devices operably coupled to the one or more processing devices, the one or more memory devices storing executable code effective to cause the one or more processing devices to:
   receive an original point cloud from a LIDAR (light detection and ranging) sensor of a controller of a vehicle;
   identify available space in the original point cloud;
   place an object model at a location in the available space; and
   obtain an augmented point cloud by modeling sensing of the object model by the LIDAR sensor and adding a simulated point cloud to the original point cloud.

12. The system of claim 11, wherein the executable code is further effective to cause the one or more processing devices to:
   identify obscured points of the original point cloud such that the object model would be positioned between the obscured points and the LIDAR sensor; and
   remove the obscured points from the point cloud.

13. The system of claim 12, wherein the executable code is further effective to cause the one or more processing devices to:
   define a shadow cone of the object model with respect to a location of the LIDAR sensor on the vehicle;
   define a triangle mesh version of the object model;
   search for the obscured points only within the shadow cone; and
   identify the obscured points as being located such that a ray extending from each point of the obscured points to the location of the LIDAR sensor intersects at least one triangle of the triangle mesh.

14. The system of claim 11, wherein the executable code is further effective to cause the one or more processing devices to:
   identify a two dimensional area of the available space around the location;
   fit a plane to points of the original point cloud within the two-dimensional area; and
   transform the object model according to an orientation of the plane.

15. The system of claim 14, wherein the executable code is further effective to cause the one or more processing devices to:
   identify the two-dimensional area as being covered by the object model;
   evaluate whether (a) the two-dimensional area covers insufficient points of the original point cloud to define the plane; and
   if (a), expand the area until the two-dimensional area covers sufficient points of the point cloud to fit the plane.

16. The system of claim 11, wherein the executable code is further effective to cause the one or more processing devices to identify the available space around the vehicle in the sensor data by:
   evaluating a Z coordinate of X, Y, and Z coordinates defining each point of the original point cloud; and
   identifying as the available space those regions in which the Z coordinate of points in the original point cloud within the regions are less than a threshold height.

17. The system of claim 16, wherein the Z coordinates of the original point cloud are measured perpendicular to a horizontal plane of the vehicle.

18. The system of claim 11, wherein the executable code is further effective to cause the one or more processing devices to test at least one of a control algorithm and a detection algorithm according to the augmented point cloud.

19. The system of claim 11, wherein the executable code is further effective to cause the one or more processing devices to train a machine learning model to detect obstacles according to the augmented point.

20. The system of claim 11, wherein the executable code is further effective to cause the one or more processing devices to train a machine learning model to remove objects from LIDAR sensor data according to the augmented point cloud.

* * * * *